(12) United States Patent
Sasaki et al.

(10) Patent No.: US 12,074,014 B2
(45) Date of Patent: Aug. 27, 2024

(54) ELECTROSTATIC CHUCK AND PROCESSING APPARATUS

(71) Applicant: TOTO LTD., Kitakyushu (JP)

(72) Inventors: Yuki Sasaki, Kitakyushu (JP); Jun Shiraishi, Kitakyushu (JP); Yutaka Momiyama, Kitakyushu (JP); Reo Kawano, Kitakyushu (JP)

(73) Assignee: Toto Ltd., Kitakyushu (JP)

( * ) Notice: Subject to any disclaimer, the term of this patent is extended or adjusted under 35 U.S.C. 154(b) by 214 days.

(21) Appl. No.: 17/897,445

(22) Filed: Aug. 29, 2022

(65) Prior Publication Data
US 2023/0068968 A1  Mar. 2, 2023

(30) Foreign Application Priority Data

Aug. 31, 2021 (JP) ................................ 2021-141370
Jul. 15, 2022 (JP) ................................ 2022-114207

(51) Int. Cl.
*H01L 21/683* (2006.01)
*H01J 37/32* (2006.01)

(52) U.S. Cl.
CPC . *H01J 37/32715* (2013.01); *H01J 2237/2007* (2013.01)

(58) Field of Classification Search
CPC ..... H01L 21/683–687; H01L 21/68785; H01L 21/6831; H01L 21/6833; H01L 21/67109; H05K 3/03; H05K 3/0306; H01J 37/12; H01J 37/145; H01J 37/1477
USPC ........................................ 361/103, 145, 234
See application file for complete search history.

(56) References Cited

U.S. PATENT DOCUMENTS

| | | | |
|---|---|---|---|
| 6,538,872 B1* | 3/2003 | Wang | H01L 21/6833 361/103 |
| 10,497,600 B2 | 12/2019 | Yamaguchi et al. | |
| 11,276,602 B2 | 3/2022 | Shiraishi et al. | |
| 2013/0308244 A1* | 11/2013 | Shiraiwa | H02N 13/00 361/234 |
| 2014/0202635 A1* | 7/2014 | Yamaguchi | H01L 21/6831 279/128 |

(Continued)

FOREIGN PATENT DOCUMENTS

| | | |
|---|---|---|
| JP | 2010-123712 A | 6/2010 |
| JP | 6489277 B1 | 3/2019 |

(Continued)

*Primary Examiner* — Tuan T Dinh
(74) *Attorney, Agent, or Firm* — Carrier, Shende & Associates P.C.; Joseph P. Carrier; Fulchand P. Shende

(57) ABSTRACT

An electrostatic chuck includes a ceramic dielectric substrate, a base plate, a bonding part, a gas inlet path, a counterbore part, and a ceramic porous part. The bonding part is located between the ceramic dielectric substrate and the base plate. The gas inlet path extends through the ceramic dielectric substrate, the base plate, and the bonding part. The gas inlet path includes a first hole part, a second hole part, and a third hole part. The first hole part is positioned at the ceramic dielectric substrate. The second hole part is positioned at the base plate. The third hole part is positioned at the bonding part. The counterbore part is located in at least one of the first hole part or the second hole part. The ceramic porous part is located in the counterbore part. The ceramic porous part includes an exposed surface exposed in the third hole part.

7 Claims, 9 Drawing Sheets

(56) References Cited

U.S. PATENT DOCUMENTS

| | | | |
|---|---|---|---|
| 2016/0276198 A1* | 9/2016 | Anada | H01L 21/6831 |
| 2017/0352568 A1 | 12/2017 | Cho et al. | |
| 2019/0287839 A1* | 9/2019 | Yamaguchi | H01L 21/6833 |
| 2020/0135528 A1 | 4/2020 | Shiraishi et al. | |

FOREIGN PATENT DOCUMENTS

| | | |
|---|---|---|
| JP | 2020-072261 A | 5/2020 |
| JP | 2020-150257 A | 9/2020 |
| JP | 2021-057468 A | 4/2021 |

* cited by examiner

ELECTROSTATIC CHUCK AND PROCESSING APPARATUS

CROSS-REFERENCE TO RELATED APPLICATIONS

This application is based upon and claims the benefit of priority from Japanese Patent Application No. 2021-141370, filed on Aug. 31, 2021, and No. 2022-114207, filed on Jul. 15, 2022; the entire contents of which are incorporated herein by reference.

FIELD

Embodiments described herein relate generally to an electrostatic chuck and a processing apparatus.

BACKGROUND

An electrostatic chuck that includes an electrode and a ceramic dielectric substrate of alumina or the like clamps a substrate such as a silicon wafer or the like by an electrostatic force by applying electrical power for electrostatic clamping to the electrode. In such an electrostatic chuck, the temperature of the substrate that is the clamping object is controlled by causing an inert gas such as helium (He) or the like to flow between the front surface of the ceramic dielectric substrate and the back surface of the substrate that is the clamping object.

For example, a temperature rise of the substrate may accompany the processing in an apparatus that processes the substrate such as a CVD (Chemical Vapor Deposition) apparatus, a sputtering apparatus, an ion implantation apparatus, an etching apparatus, etc. In an electrostatic chuck used in such an apparatus, the temperature rise of the substrate is suppressed by causing an inert gas such as He or the like to contact the substrate by causing the inert gas to flow between the ceramic dielectric substrate and the substrate that is the clamping object.

In the electrostatic chuck that controls the substrate temperature with an inert gas such as He or the like, a hole (a gas inlet path) for introducing the inert gas such as He or the like is provided in the ceramic dielectric substrate and in a base plate supporting the ceramic dielectric substrate. A through-hole that communicates with the gas inlet path of the base plate is provided in the ceramic dielectric substrate. Thereby, the inert gas that is introduced through the gas inlet path of the base plate passes through the through-hole of the ceramic dielectric substrate and is guided to the back surface of the substrate.

Here, when the substrate is processed inside the apparatus, there are cases where electrical discharge (arcing) occurs from the plasma inside the apparatus toward the base plate that is made of metal. There are cases where the gas inlet path of the base plate and/or the through-hole of the ceramic dielectric substrate easily becomes a path for the electrical discharge. Therefore, there is technology that improves the resistance to arcing (the breakdown voltage, etc.) by providing a porous part in the gas inlet path of the base plate and/or the through-hole of the ceramic dielectric substrate. For example, JP-A 2010-123712 (Kokai) discusses an electrostatic chuck that improves the insulative properties inside the gas inlet path by providing a ceramic sintered porous body inside the gas inlet path and by using membrane pores and the structure of the ceramic sintered porous body as the gas flow path. Also, USP 2017/0352568 discusses an electrostatic chuck in which a ceramic porous body is located in the gas inlet path of the base plate and the through-hole of the ceramic dielectric substrate. Furthermore, in JP-A 2021-057468 (Kokai), a ceramic porous body is located in the gas inlet path of the base plate or the through-hole of the ceramic dielectric substrate, and a protectant material is located at locations where the adhesive layer that bonds the base plate and the ceramic dielectric substrate is exposed in the gas inlet path and/or the through-hole, and it is stated that corrosion of the adhesive is suppressed.

It is desirable for such an electrostatic chuck to maintain the suppression effect of the arcing for a long period of time.

SUMMARY

According to the embodiment, an electrostatic chuck includes a ceramic dielectric substrate, a base plate, a bonding part, a gas inlet path, a counterbore part, and a ceramic porous part. The ceramic dielectric substrate includes a first major surface and a second major surface. An object of clamping is placed on the first major surface. The second major surface is at a side opposite to the first major surface. The base plate supports the ceramic dielectric substrate. the base plate includes an upper surface and a lower surface. The upper surface is at the ceramic dielectric substrate side. The lower surface is at a side opposite to the upper surface. The bonding part is located between the ceramic dielectric substrate and the base plate. The gas inlet path extends through the ceramic dielectric substrate, the base plate, and the bonding part. The gas inlet path includes a first hole part, a second hole part, and a third hole part. The first hole part is positioned at the ceramic dielectric substrate. The second hole part is positioned at the base plate. The third hole part is positioned at the bonding part. The counterbore part is located in at least one of the first hole part or the second hole part. The ceramic porous part is located in the counterbore part. The ceramic porous part includes an exposed surface exposed in the third hole part. A first direction is a direction from the base plate toward the ceramic dielectric substrate. A second direction is a direction substantially orthogonal to the first direction. The ceramic porous part includes a porous portion and a dense portion. The porous portion is gas-permeable. The dense portion is denser than the porous portion. The dense portion covers an outer circumference of the porous portion. At least a part of the dense portion includes a first protruding part protruding toward the third hole part along the first direction from the exposed surface.

DETAILED DESCRIPTION

Figure 1:
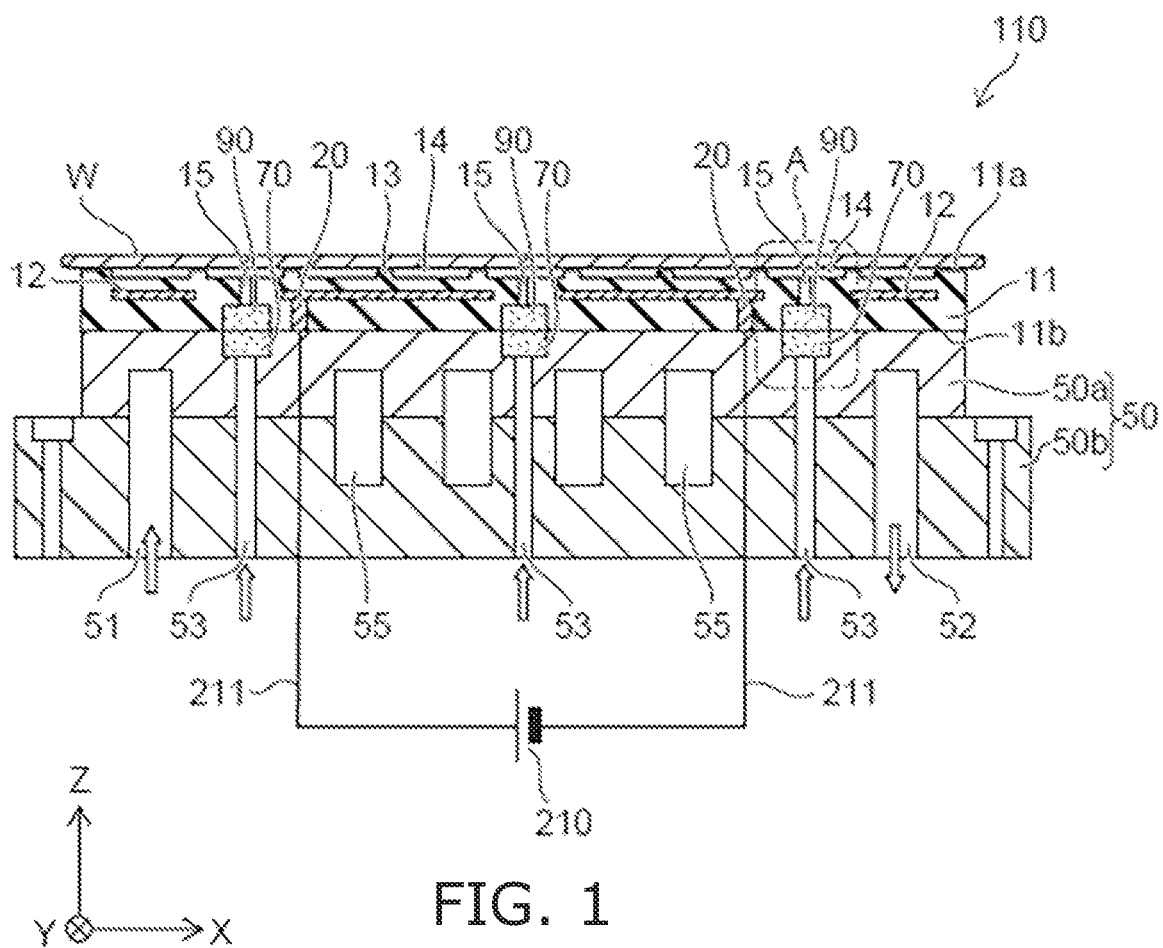
FIG. 1 is a schematic cross-sectional view illustrating an electrostatic chuck according to an embodiment.

A first invention is an electrostatic chuck including: a ceramic dielectric substrate including a first major surface on which an object of clamping is placed, and a second major surface at a side opposite to the first major surface; a base plate supporting the ceramic dielectric substrate and including an upper surface at the ceramic dielectric substrate side and a lower surface at a side opposite to the upper surface; a bonding part located between the ceramic dielectric substrate and the base plate; a gas inlet path extending through the ceramic dielectric substrate, the base plate, and the bonding part and including a first hole part positioned at the ceramic dielectric substrate, a second hole part positioned at the base plate, and a third hole part positioned at the bonding part; a counterbore part located in at least one of the first hole part or the second hole part; and a ceramic porous part that is located in the counterbore part and includes an exposed surface exposed in the third hole part, wherein a first direction is a direction from the base plate toward the ceramic dielectric substrate; a second direction is a direction substantially orthogonal to the first direction; the ceramic porous part includes a porous portion that is gas-permeable and a dense portion that is denser than the porous portion; the dense portion covers an outer circumference of the porous portion; and at least a part of the dense portion includes a first protruding part protruding toward the third hole part along the first direction from the exposed surface.

In the electrostatic chuck, the ceramic porous part is located in the gas inlet path; and at least a part of the dense portion includes the first protruding part protruding toward the third hole part along the first direction from the exposed surface. Arcing can be suppressed thereby. There is a risk that particles may be generated by the part of the bonding part exposed in the third hole part being corroded by the plasma when the electrostatic chuck is used. The first protruding part of the ceramic porous part forms a physical barrier; and the penetration into the porous part of the particles generated by the plasma corrosion can be suppressed. Accordingly, the suppression effect of the arcing can be maintained for a long period of time.

A second invention is the electrostatic chuck of the first invention, wherein the length from the exposed surface along the first direction of the first protruding part is substantially equal to the length along the first direction of the bonding part.

According to the electrostatic chuck, the arcing resistance can be further increased. The penetration of the particles can be more effectively suppressed, and the suppression effect of the arcing can be maintained for a long period of time.

A third invention is the electrostatic chuck of the first or second invention, wherein the counterbore part is located in the first hole part.

According to the electrostatic chuck, the arcing resistance can be further increased because the ceramic porous part is located in the first hole part positioned more proximate to the plasma. Also, because the first protruding part is provided, the penetration of particles into the ceramic porous part even though the ceramic porous part is located in the first hole part and is positioned at the downstream side of the third hole part that may become a particle generation part in the gas flow can be more effectively suppressed, and the suppression effect of the arcing can be maintained for a long period of time.

A fourth invention is the electrostatic chuck of the third invention, wherein the first hole part includes a first part open at the first major surface side, a second part open at the second major surface side, and a middle part located between the first part and the second part, the counterbore part is located in the second part, the length of the middle part along the second direction is greater than the length of the first part along the second direction, the ceramic porous part includes a surface at a side opposite to the exposed surface, and the surface is exposed in the middle part.

According to the electrostatic chuck, the surface of the ceramic porous part located in the counterbore part located in the first hole part at the side opposite to the exposed surface, i.e., the surface at the first major surface side, is exposed in the middle part of the first hole part. A space that corresponds to the middle part is provided between the first part and the surface of the ceramic porous part at the first major surface side because the lateral width (the length along the second direction) of the middle part is greater than the lateral width of the first part. Therefore, the gas flow rate can be more reliably ensured.

A fifth invention is the electrostatic chuck of the fourth invention, wherein the dense portion further includes a second protruding part protruding toward the first part along the first direction from the surface.

According to the electrostatic chuck, the arcing resistance can be further increased.

A sixth invention is an electrostatic chuck including: a ceramic dielectric substrate including a first major surface on which an object of clamping is placed, and a second major surface at a side opposite to the first major surface; a base plate supporting the ceramic dielectric substrate and including an upper surface at the ceramic dielectric substrate side and a lower surface at a side opposite to the upper surface; a bonding part located between the ceramic dielectric substrate and the base plate; a gas inlet path extending through the ceramic dielectric substrate, the base plate, and the bonding part and including a first hole part positioned at the ceramic dielectric substrate, a second hole part positioned at the base plate, and a third hole part positioned at the bonding part; a counterbore part located in the second hole part; and a ceramic porous part that is located in the counterbore part and includes an exposed surface exposed in the third hole part, wherein a first direction is a direction from the base plate toward the ceramic dielectric substrate; a second direction is a direction substantially orthogonal to the first direction; the ceramic porous part includes a porous portion that is gas-permeable and a dense portion that is denser than the porous portion; the dense portion covers an outer circumference of the porous portion; at least a part of the dense portion includes a first protruding part protruding toward the third hole part along the first direction from the exposed surface; and the first hole part includes a plurality of pores.

In the electrostatic chuck, the ceramic porous part is located in the second hole part of the gas inlet path, the dense portion covers the outer circumference of the porous portion, and at least a part of the dense portion includes the first protruding part protruding along the first direction from the exposed surface exposed in the third hole part. Also, the first hole part includes the multiple pores. Therefore, arcing can be suppressed. There is a risk that particles may be generated by the part of the bonding part exposed in the third hole part being corroded by the plasma when the electrostatic chuck is used. The first protruding part forms a physical barrier; and the penetration of the particles generated by the plasma corrosion into the multiple pores (the first hole part) positioned at the downstream side of the ceramic porous part and the third hole part can be suppressed. Accordingly, the suppression effect of the arcing can be maintained for a long period of time.

A seventh invention is a processing apparatus that includes any one of the electrostatic chucks described above, and a supply part configured to supply a gas to the gas inlet path of the electrostatic chuck. According to the processing apparatus, the suppression effect of the arcing can be maintained for a long period of time.

Exemplary embodiments will now be described with reference to the drawings. Similar components in the drawings are marked with the same reference numerals; and a detailed description is omitted as appropriate.

In each drawing, the direction from a base plate 50 toward a ceramic dielectric substrate 11 is taken as a Z-direction (corresponding to an example of a first direction); one direction substantially orthogonal to the Z-direction is taken as a Y-direction (corresponding to an example of a second direction); and a direction substantially orthogonal to the Z-direction and the Y-direction is taken as an X-direction (corresponding to an example of a second direction).

Electrostatic Chuck

FIG. 1 is a schematic cross-sectional view illustrating an electrostatic chuck according to an embodiment.

As shown in FIG. 1, the electrostatic chuck 110 according to the embodiment includes the ceramic dielectric substrate 11, the base plate 50, and a porous part 90. In the example, the electrostatic chuck 110 further includes a porous part 70.

The ceramic dielectric substrate 11 is, for example, a base material having a flat plate shape made of a sintered ceramic. For example, the ceramic dielectric substrate 11 includes aluminum oxide ($Al_2O_3$). For example, the ceramic dielectric substrate 11 is formed of high-purity aluminum oxide. The concentration of aluminum oxide in the ceramic dielectric substrate 11 is, for example, not less than 99 atomic percent (atomic %) and not more than 100 atomic %. By using high-purity aluminum oxide, the plasma resistance of the ceramic dielectric substrate 11 can be improved. The ceramic dielectric substrate 11 includes a first major surface 11a on which an object W (a clamping object) is placed, and a second major surface 11b at the side opposite to the first major surface 11a. The object W is, for example, a semiconductor substrate such as a silicon wafer, etc.

An electrode 12 is located in the ceramic dielectric substrate 11. The electrode 12 is located between the first major surface 11a and the second major surface 11b of the ceramic dielectric substrate 11. The electrode 12 is inserted into the ceramic dielectric substrate 11. A power supply 210 is electrically connected to the electrode 12 via a connection part 20 and wiring 211. By applying a clamping voltage to the electrode 12, the power supply 210 can generate a charge at the first major surface 11a side of the electrode 12 and clamp the object W by an electrostatic force.

The electrode 12 has a thin film shape along the first and second major surfaces 11a and 11b of the ceramic dielectric substrate 11. The electrode 12 is a clamping electrode for clamping the object W. The electrode 12 may be monopolar or bipolar. The electrode 12 illustrated in FIG. 1 is bipolar; and the two poles of the electrode 12 are located in the same plane. In addition to the electrode 12, a high-frequency application electrode and/or a heater electrode may be included in the ceramic dielectric substrate 11.

A connection part 20 that extends toward the second major surface 11b side of the ceramic dielectric substrate 11 is located at the electrode 12. The connection part 20 is, for example, a via (solid) or a via hole (hollow) that is electrically connected with the electrode 12. The connection part 20 may be a metal terminal connected by an appropriate method such as brazing, etc.

The base plate 50 is a member supporting the ceramic dielectric substrate 11. The base plate 50 includes an upper surface 50u at the ceramic dielectric substrate 11 side and a lower surface 50d at the side opposite to the upper surface 50u. The ceramic dielectric substrate 11 is fixed on the base plate 50 by a bonding part 60 illustrated in FIG. 2A. For example, the bonding part 60 can be a cured silicone adhesive. In the example, the upper surface 50u of the base plate 50 and the second major surface 11b of the ceramic dielectric substrate 11 are configured to contact the bonding part 60.

For example, the base plate 50 is made of metal. For example, the base plate 50 is divided into an upper part 50a and a lower part 50b made of aluminum; and a communicating path 55 is located between the upper part 50a and the lower part 50b. One end of the communicating path 55 is connected to an inlet path 51; and the other end of the communicating path 55 is connected to an outlet path 52. The base plate 50 may include a thermal spraying part (not illustrated) at the end part at the second major surface 11b side. For example, the thermal spraying part is formed by thermal spraying. The end surface (the upper surface 50u) of the base plate 50 at the second major surface 11b side may be formed of the thermal spraying part. The thermal spraying part is provided as necessary and is omissible.

The base plate 50 also performs the role of temperature regulation of the electrostatic chuck 110. For example, when cooling the electrostatic chuck 110, a cooling medium is caused to flow in through the inlet path 51, pass through the communicating path 55, and outflow from the outlet path 52. Thereby, the heat of the base plate 50 can be absorbed by the cooling medium; and the ceramic dielectric substrate 11 that is mounted on the base plate 50 can be cooled. On the other hand, when maintaining the temperature of the electrostatic chuck 110, it is also possible to introduce a heat-retaining medium into the communicating path 55. It is also possible to embed a heating element in the ceramic dielectric substrate 11 and/or the base plate 50. The temperature of the object W clamped by the electrostatic chuck 110 can be regulated by regulating the temperature of the base plate 50 and/or the ceramic dielectric substrate 11.

Dots 13 are provided as necessary at the first major surface 11a side of the ceramic dielectric substrate 11; and a groove 14 is provided between the dots 13. In other words, the first major surface 11a is an uneven surface and includes recesses and protrusions. The protrusions of the first major surface 11a correspond to the dots 13; and the recess of the first major surface 11a corresponds to the groove 14. For example, the groove 14 can extend continuously in the XY plane. Thereby, a gas such as He, etc., can be distributed to the entire first major surface 11a. A space is formed between the back surface of the object W placed on the electrostatic chuck 110 and the first major surface 11a that includes the groove 14.

The temperature of the object W and/or particles that are adhered to the object W can be controlled to be in a favorable state by appropriately selecting the height of the dots 13, the depth of the groove 14, the surface area ratio and shape of the dots 13 and the groove 14, etc.

A gas inlet path 53 extends through the ceramic dielectric substrate 11, the base plate 50, and the bonding part 60. The gas inlet path 53 includes a first hole part 53a positioned at the ceramic dielectric substrate 11, a second hole part 53b positioned at the base plate 50, and a third hole part 53c positioned at the bonding part 60. For example, the second hole part 53b extends through the base plate 50. The second hole part 53b may linearly extend through the base plate 50 or may be branched partway. The gas inlet path 53 may be provided in multiple locations of the base plate 50.

For example, the first hole part 53a is connected with the groove 14. The first hole part 53a is provided from the second major surface 11b to the first major surface 11a. In other words, the first hole part 53a extends in the Z-direction from the second major surface 11b to the first major surface 11a and extends through the ceramic dielectric substrate 11.

The second hole part 53b communicates with the first hole part 53a via the third hole part 53c. The gas (helium (He), etc.) that flows into the second hole part 53b passes through the second hole part 53b, then passes through the third hole part 53c, and then flows into the first hole part 53a.

The gas that flows into the first hole part 53a passes through the first hole part 53a and then flows into the space located between the object W and the first major surface 11a that includes the groove 14. Thereby, the object W can be directly cooled by the gas.

A counterbore part 53s is located in at least one of the first hole part 53a or the second hole part 53b. The porous part 90 and/or the porous part 70 is located in the counterbore part 53s.

The first hole part 53a includes a first part 53aa that includes the first major surface 11a, and a second part 53ab that includes the second major surface 11b. Another part (e.g., a middle part 53ac described below) may be included between the first part 53aa and the second part 53ab. For example, the counterbore part 53s is located in the second part 53ab.

The second hole part 53b includes a third part 53bu including the upper surface 50u and a fourth part 53bd including the lower surface 50d. Another part may be included between the third part 53bu and the fourth part 53bd. For example, the counterbore part 53s is located in the third part 53bu.

The porous part 90 and/or the porous part 70 is located in the counterbore part 53s. The porous part 90 includes a first surface 90a that is an exposed surface exposed in the third hole part 53c and a second surface 90b at the side opposite to the first surface 90a. The porous part 70 includes a third surface 70a that is an exposed surface exposed in the third hole part 53c, and a fourth surface 70b at the side opposite to the third surface 70a. In the specification, the porous part is called the porous part 90 when located in the interior (the first hole part 53a) of the ceramic dielectric substrate 11 and is called the porous part 70 when located in the interior (the second hole part 53b) of the base plate 50.

In the gas inlet path 53, the cooling gas such as helium or the like flows in the order of the second hole part 53b, the third hole part 53c, and the first hole part 53a and is supplied to the first major surface 11a side of the ceramic dielectric substrate 11 via, for example, the groove 14. The plasma is positioned at the first major surface 11a side when the electrostatic chuck is used. Accordingly, when the ceramic porous part 90 is located in the first hole part 53a and the ceramic porous part 70 is located in the second hole part 53b, it is desirable for the ceramic porous part 90 that is located more proximate to the plasma to have a higher arcing resistance than the ceramic porous part 70. As an example, the pore size of a first porous portion 91 (details below) of the porous part 90 is set to be less than the pore size of a second porous portion 71 of the porous part 70; and the porosity of the first porous portion 91 is set to be less than the porosity of the second porous portion 71. Such a configuration is favorable from the perspective of the gas flow rate control because the gas permeability of the porous part 70 positioned at the upstream side of the gas flow can be greater than the gas permeability of the porous part 90 positioned at the downstream side of the gas flow.

Figures 2A, 2B:
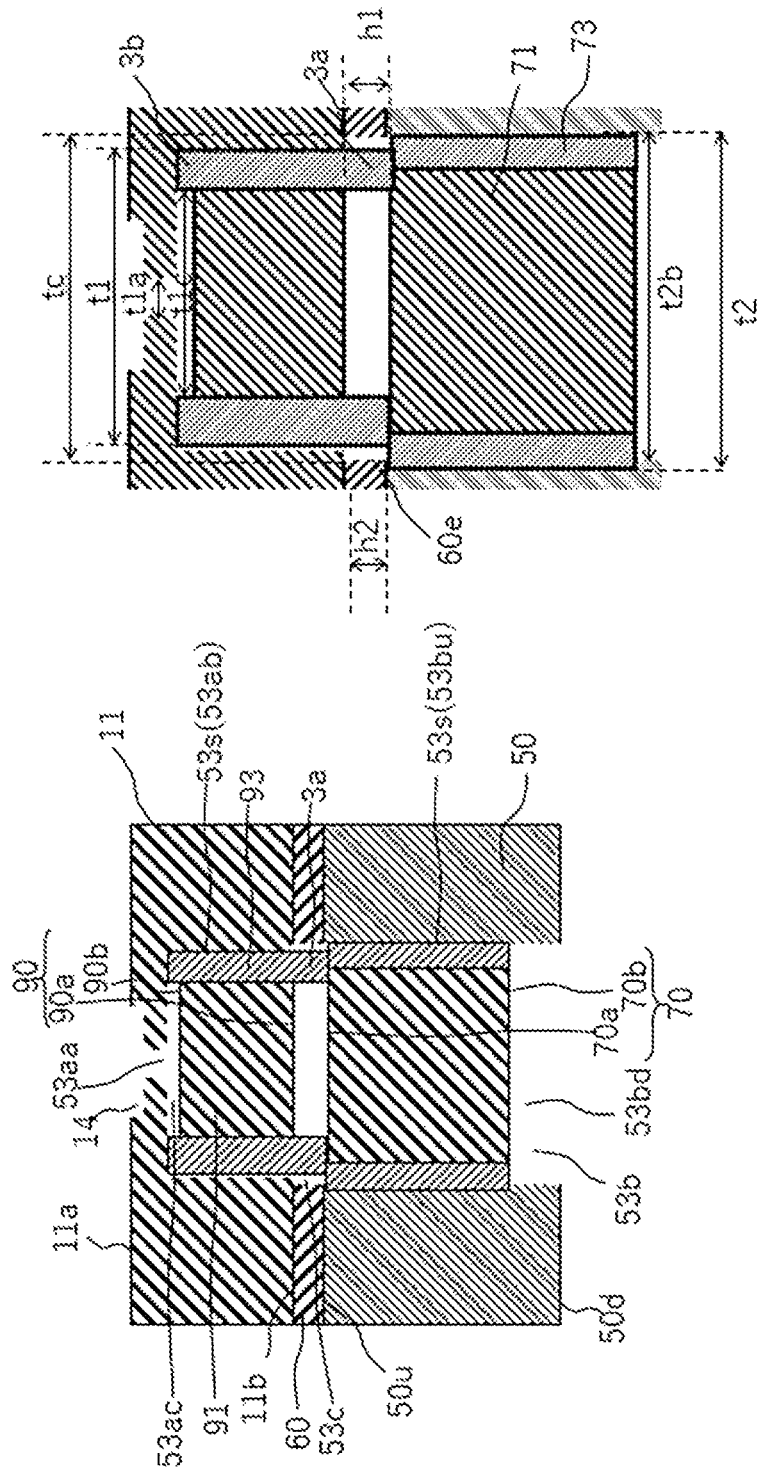
FIGS. 2A and 2B are schematic views illustrating the electrostatic chuck according to the embodiment.
Figure 3:
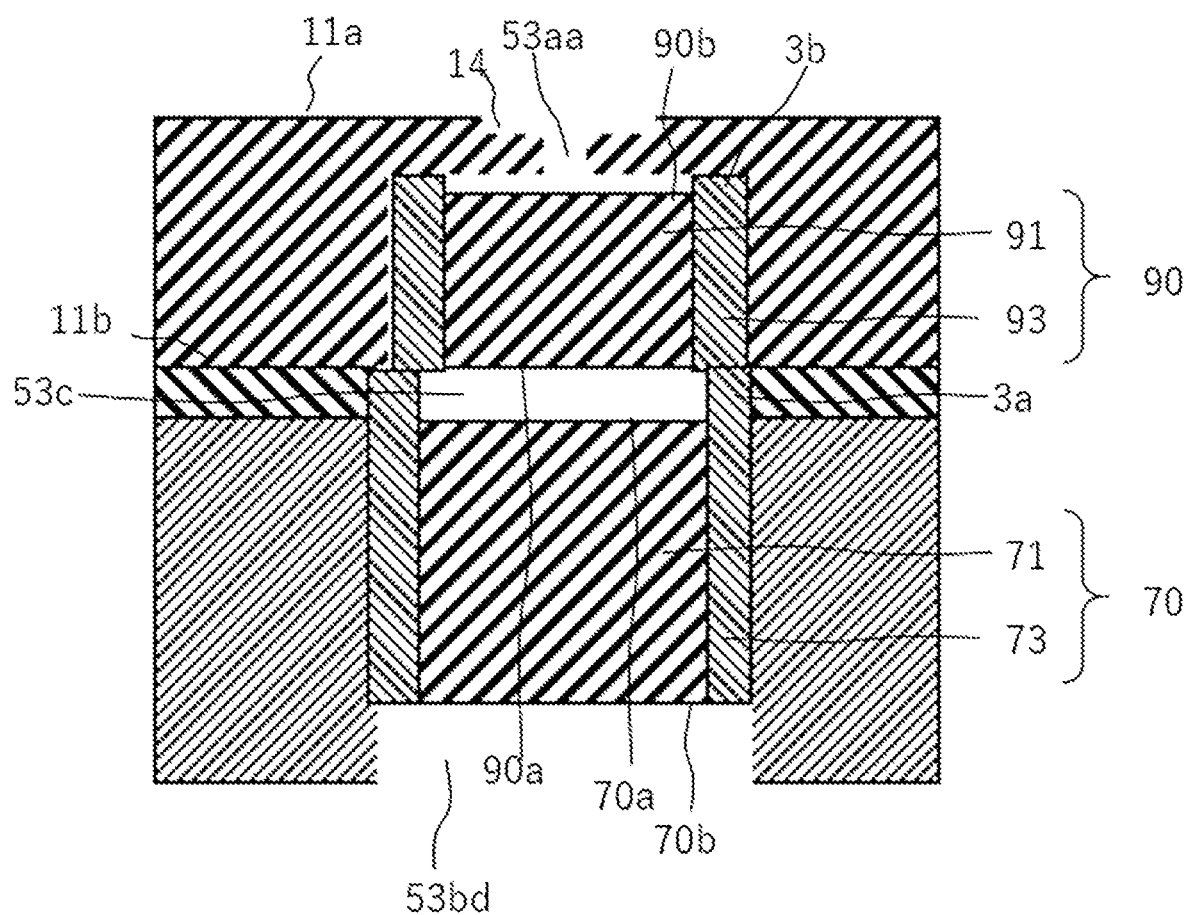
FIG. 3 is a schematic view illustrating the electrostatic chuck according to the embodiment.

FIGS. 2A and 2B and FIG. 3 are schematic views illustrating the electrostatic chuck according to the embodiment.

FIGS. 2 and 3 are schematic cross-sectional views illustrating the periphery of the porous parts 90 and 70, and corresponds to an enlarged view of region A shown in FIG. 1. FIG. 2B is an enlarged view of the region shown in FIG. 2A.

The dots 13 (e.g., see FIG. 1) are not illustrated in FIGS. 2A and 2B to avoid complexity.

In the example as shown in FIGS. 2A and 2B, the porous part 90 is located in the counterbore part 53s located in the first hole part 53a; and the porous part 70 is located in the counterbore part 53s located in the second hole part 53b. The first surface 90a of the porous part 90 is an exposed surface exposed in the third hole part 53c. The first surface 90a and the second major surface 11b of the ceramic dielectric substrate 11 are substantially coplanar. The third surface 70a of the porous part 70 is an exposed surface exposed in the third hole part 53c. The third surface 70a and the upper surface 50u of the base plate 50 are substantially coplanar.

In the example, a length ts along the X or Y-direction of the counterbore part 53s located in the first hole part 53a is less than or equal to a length tc along the X or Y-direction of the third hole part 53c. A length t1 along the X or Y-direction of the porous part 90 is less than or equal to the length ts. Therefore, the arcing suppression effect can be increased.

Electrical discharge between the counterbore part 53s and the side surface of the porous part 90 (the surface perpendicular to the first and second surfaces 90a and 90b) can be suppressed by setting the lateral width (the length t1) of the porous part 90 to be equal to the lateral width (the length ts) of the counterbore part 53s. For example, the length t1 and the length ts can be set to be equal by sintering the ceramic dielectric substrate 11 and the porous part 90 to have a continuous body.

FIGS. 2A and 2B will now be described.

In the example, the porous part 90 is located in the first hole part 53a; the porous part 70 is located in the second hole part 53b; and the porous part 90 includes a first protruding part 3a.

The porous part 90 includes the first porous portion 91 and a first dense portion 93. The first porous portion 91 is gas-permeable. The first dense portion 93 is more dense than the first porous portion 91. The porosity of the first porous portion 91 is greater than the porosity of the first dense portion 93. The first porous portion 91 has multiple pores. It is favorable for the multiple pores to be linear pores with a prescribed range of pore sizes. In such a case, the pore size is, for example, 1 μm to 30 μm. The multiple pores may be randomly arranged while communicating with each other. The first dense portion 93 may be substantially gas-impermeable. The first dense portion 93 covers the outer circumference of the first porous portion 91. The rigidity of the porous part 90 can be increased by including the first dense portion 93. For example, when an adhesive is located between the counterbore part 53s and the side surface of the porous part 90 (the surface perpendicular to the first and second surfaces 90a and 90b), the degradation of the gas permeability of the porous part 90 due to penetration of the adhesive can be suppressed by providing the first dense portion 93.

Similarly, in the example, the porous part 70 includes the second porous portion 71 and a second dense portion 73. The second porous portion 71 is gas-permeable. The second dense portion 73 is more dense than the second porous portion 71. The porosity of the second porous portion 71 is greater than the porosity of the second dense portion 73. The second dense portion 73 may be substantially gas-impermeable. The second dense portion 73 covers the outer circumference of the second porous portion 71. When the multiple pores in the second porous portion 71 are linear pores with a prescribed range of pore sizes, the pore size may be greater than that of the first porous portion 91.

For example, the density of the first porous portion 91 is less than the density of the first dense portion 93. For example, the gas permeability of the first porous portion 91 is greater than the gas permeability of the first dense portion 93. For example, the first porous portion 91 is cylindrical. The first dense portion 93 contacts the outer circumference side surface of the first porous portion 91. The first dense portion 93 has a ring shape (a tube shape) surrounding the outer circumference side surface of the first porous portion 91.

For example, the density of the second porous portion 71 is less than the density of the second dense portion 73. For example, the gas permeability of the second porous portion 71 is greater than the gas permeability of the second dense portion 73. For example, the second porous portion 71 is cylindrical. The second dense portion 73 contacts the outer circumference side surface of the second porous portion 71. The second dense portion 73 has a ring shape (a tube shape) surrounding the outer circumference side surface of the second porous portion 71.

As shown in FIGS. 2A and 2B, at least a part of the first dense portion 93 of the porous part 90 includes the first protruding part 3a protruding toward the third hole part 53c along the Z-direction from the first surface 90a that is the exposed surface. Here, the first surface 90a is the surface of the porous part 90 having the largest surface area at the third hole part 53c side. In the example, the first porous portion 91 includes the first surface 90a.

In other words, for example, the first surface 90a is the lower surface of the first porous portion 91. For example, the first protruding part 3a is the part of the first dense portion 93 protruding downward (in the direction from the ceramic dielectric substrate 11 toward the base plate 50) from the first surface 90a. In such a case, the first protruding part 3a is the part of the first dense portion 93 positioned lower than the first surface 90a. The planar shape in the XY plane of the first protruding part 3a is, for example, ring-shaped.

In the electrostatic chuck 110, the ceramic porous part 90 is located in, for example, the first hole part 53a of the gas inlet path 53; and at least a part of the first dense portion 93 of the porous part 90 includes the first protruding part 3a protruding along the Z-direction from the exposed surface (the first surface 90a) of the porous part 90 at the third hole part 53c side. Therefore, arcing can be suppressed. There is a risk that particles may be generated by an end part 60e of the bonding part 60 exposed in the third hole part 53c being corroded by the plasma when the electrostatic chuck is used. In such a case as well, the first protruding part 3a of the ceramic porous part 90 becomes a physical barrier; and the penetration into the first porous portion 91 of the porous part 90 and/or the second porous portion 71 of the porous part 70 by the particles generated by the plasma corrosion can be suppressed. Accordingly, the suppression effect of the arcing can be maintained for a long period of time.

In the example, the first protruding part 3a contacts the third surface 70a of the porous part 70. The first protruding part 3a contacts the upper surface 50u of the base plate 50 when the counterbore part 53s is not provided in the second hole part 53b, that is, when the porous part 70 is not included.

In the example, a protruding length h1 is the length from the exposed part (the first surface 90a) of the first protruding part 3a along the Z-direction, and is substantially equal to a length h2 along the Z-direction of the bonding part 60. The arcing resistance can be further increased thereby. Also, the penetration of the particles can be more effectively suppressed, and the suppression effect of the arcing can be maintained for a long period of time. In the example, the tip of the first protruding part 3a contacts the third surface 70a of the porous part 70. When the first protruding part 3a is ring-shaped and the tip of the first protruding part 3a contacts the third surface 70a, the gas flow and the end part 60e of the bonding part 60 can be physically blocked; therefore, the penetration of the particles into the porous part 90 and/or the porous part 70 can be effectively suppressed, and the decrease of the flow rate over time due to the particles plugging the porous part is suppressed.

For example, the protruding length h1 of the first protruding part 3a may be less than the length h2 along the Z-direction of the bonding part 60 when the first surface 90a overlaps the bonding part 60 when viewed along the X or Y-direction.

In other words, the protruding length h1 may be less than the length h2 when the first surface 90a is arranged with (overlaps) the bonding part 60 in the second direction. In the example of FIG. 2B, the protruding length h1 is the distance between the Z-direction position of the first surface 90a and the Z-direction position of the lower end of the first protruding part 3a.

In the example, in addition to the first part 53aa open at the first major surface 11a side and the second part 53ab open at the second major surface 11b side, the first hole part 53a includes the middle part 53ac located between the first part 53aa and the second part 53ab. The counterbore part 53s is located in the second part 53ab. In the example, the first part 53aa opens into the groove 14 provided in the first major surface 11a. The middle part 53ac is positioned between the first part 53aa and the second surface 90b of the porous part 90. The second surface 90b that is the surface of the porous part 90 at the side opposite to the exposed surface (the first surface 90a) is exposed in the middle part 53ac. A length t1c of the middle part 53ac along the X or Y-direction is greater than a length t1a of the first part 53aa along the X or Y-direction.

The second surface 90b of the porous part 90 is directly exposed to the plasma via the first hole part 53a when the electrostatic chuck is used. It is therefore necessary for the porous part 90 to have a higher arcing resistance than the porous part 70, and there are cases where the gas permeability of the porous part 90 is set to be less than the gas permeability of the porous part 70 as described above. By providing the middle part 53ac, the gas permeability can be increased, and a constant gas flow rate can be easily obtained.

In the example, the first dense portion 93 further includes a second protruding part 3b protruding toward the first part 53ac along the Z-direction from the second surface 90b. The arcing resistance can be further increased thereby.

In other words, for example, the second surface 90b is the upper surface of the first porous portion 91. For example, the second protruding part 3b is the part of the first dense portion 93 protruding upward (in the direction from the base plate 50 toward the ceramic dielectric substrate 11) from the second surface 90b. In such a case, the second protruding part 3b is the part of the first dense portion 93 positioned higher than the second surface 90b. The planar shape in the XY plane of the second protruding part 3b is, for example, ring-shaped.

FIG. 3 will now be described.

In the example, the porous part 90 is located in the first hole part 53a; the porous part 70 is located in the second hole part 53b; and the porous part 70 includes the first protruding part 3a.

In the example as shown in FIG. 3, at least a part of the second dense portion 73 of the porous part 70 includes the first protruding part 3a protruding toward the third hole part 53c along the Z-direction from the third surface 70a that is the exposed surface. Here, the third surface 70a is the surface of the porous part 70 having the largest surface area at the third hole part 53c side. In the example, the second porous portion 71 includes the third surface 70a.

In other words, for example, the third surface 70a is the upper surface of the second porous portion 71. For example, the first protruding part 3a is the part of the second dense portion 73 protruding upward from the third surface 70a. In such a case, the first protruding part 3a is the part of the second dense portion 73 positioned higher than the third surface 70a.

In the electrostatic chuck 110, the ceramic porous part 70 is located in, for example, the second hole part 53b of the gas inlet path 53; and at least a part of the second dense portion 73 of the porous part 70 includes the first protruding part 3a protruding along the Z-direction from the exposed surface (the third surface 70a) of the porous part 70 at the third hole part 53c side. Therefore, arcing can be suppressed. There is a risk that particles may be generated by the end part 60e of the bonding part 60 exposed in the third hole part 53c being corroded by the plasma when the electrostatic chuck is used. In such a case as well, the first protruding part 3a of the ceramic porous part 70 becomes a physical barrier; and the penetration into the first porous portion 91 of the porous part 90 and/or the second porous portion 71 of the porous part 70 by the particles generated by the plasma corrosion can be suppressed. Accordingly, the suppression effect of the arcing can be maintained for a long period of time.

In the example, the first protruding part 3a contacts the first surface 90a of the porous part 90 and the second major surface 11b of the ceramic dielectric substrate 11. The first protruding part 3a contacts the second major surface 11b of the ceramic dielectric substrate 11 when the counterbore part 53s is not provided in the first hole part 53a, that is, when the porous part 90 is not included.

In the example, the protruding length h1, i.e., the length from the exposed part (the third surface 70a) of the first protruding part 3a along the Z-direction is substantially equal to the length h2 along the Z-direction of the bonding part 60. The arcing resistance can be further increased thereby. Also, the penetration of the particles can be more effectively suppressed, and the suppression effect of the arcing can be maintained for a long period of time. In the example, the tip of the first protruding part 3a contacts the first surface 90a of the porous part 90. When the first protruding part 3a is ring-shaped and the tip of the first protruding part 3a contacts the first surface 90a, the gas flow and the end part 60e of the bonding part 60 can be physically blocked; therefore, the penetration of the particles into the porous part 90 and/or the porous part 70 can be effectively suppressed, and the decrease of the flow rate over time due to the particles plugging the porous part is suppressed.

For example, the protruding length h1 of the first protruding part 3a may be less than the length h2 along the Z-direction of the bonding part 60 when the first surface 90a overlaps the bonding part 60 when viewed along the X or Y-direction.

For example, the protruding length h1 may be less than the length h2 when the third surface 70a is arranged with (overlaps) the bonding part 60 in the second direction. In the example of FIG. 3, the protruding length h1 is the distance between the Z-direction position of the third surface 70a and the Z-direction position of the upper end of the first protruding part 3a.

An insulative arcing suppressor part (not illustrated) may be provided in the third hole part 53c. The arcing resistance can be increased by substantially filling the space of the third hole part 53c with the arcing suppressor part. The arcing suppressor part is configured to allow a gas to pass. The arcing suppressor part may be elastic. The arcing suppressor part may include a fluorocarbon resin such as polyimide, polytetrafluoroethylene (PTFE), or the like, a resin such as epoxy, etc. The arcing suppressor part may be a ceramic. It is favorable for the gas permeability of the arcing suppressor part to be higher than the porous part 90.

The porosity of the porous part 90 may be less than the porosity of the porous part 70. The arcing resistance can be further increased by setting the porosity of the porous part 90 located in the part of the gas inlet path 53 more proximate to the plasma atmosphere to be relatively small. The porosity of the arcing suppressor part can be greater than the porosity of the porous part 90. The porosity of the arcing suppressor part can be greater than the porosity of the porous part 70.

Although the electrostatic chuck of the example of FIGS. 2 and 3 includes two porous parts (the porous part 90 and the porous part 70), the porous part is not limited thereto and is modifiable according to the object; one porous part (only the porous part 90 or only the porous part 70) may be used.

As an example, the lateral width (ts) of the counterbore part 53s is 1 mm to 5 mm. The length t1a along the X or Y-direction of the first part 53aa in the first hole part 53a is, for example, not less than 0.05 millimeters (mm) and not more than 0.5 mm.

When the first part 53aa of the first hole part 53a opens into the groove 14, the lateral width (t1a) of the first part 53aa is the width of the part of the first part 53aa contacting the groove. The lateral width (t1) of the porous part 90 and the lateral width (t2) of the porous part 70 each are the dimensions of the largest parts. It is favorable for not less than 50% of the porous part, favorably not less than 70% of the porous part, and more favorably not less than 90% of the porous part to have this dimension.

The height (h2) of the bonding part 60 is, for example, 100 µm to 1000 µm, and favorably 200 µm to 600 µm. The length along the Z-direction of the bonding part 60 is equal to the length along the Z-direction of the third hole part 53c.

In the example, the second surface 90b of the porous part 90 is positioned inside the first hole part 53a. That is, the second surface 90b and the first major surface 11a of the ceramic dielectric substrate 11 are not in the same plane. The fourth surface 70b of the porous part 70 is positioned inside the second hole part 53b. That is, the fourth surface 70b and the lower surface 50d of the base plate 50 are not in the same plane.

The materials of the porous parts 90 and 70 include insulative ceramics. The porous part 90 (the first porous portion 91 and the first dense portion 93 described below) include at least one of aluminum oxide ($Al_2O_3$), titanium oxide (TiO$_2$), or yttrium oxide (Y$_2$O$_3$). High breakdown voltage and high rigidity of the porous part 90 can be obtained thereby.

For example, the porous part 90 includes one of aluminum oxide, titanium oxide, or yttrium oxide as a major component.

In such a case, the purity of the aluminum oxide of the ceramic dielectric substrate 11 can be set to be greater than the purity of the aluminum oxide of the porous part 90. Thus, the performance of the electrostatic chuck 110 such as the plasma resistance, etc., can be ensured, and the mechanical strength of the porous part 90 can be ensured. As an example, it is possible to control the porosity and ensure the mechanical strength by promoting sintering of the porous part 90 by adding a trace additive to the porous part 90.

For details of the porous parts 90 and 70, the content of JP 6489277 is hereby incorporated herein by reference as a part of the specification.

In the specification, the ceramic purity of the aluminum oxide of the ceramic dielectric substrate 11, etc., can be measured by fluorescent X-ray analysis, ICP-AES (Inductively Coupled Plasma-Atomic Emission Spectrometry (high-frequency inductively coupled plasma optical emission spectrometry)), etc.

In the porous part, for example, the materials of the porous portions (the first porous portion 91 and the second porous portion 71) and the materials of the dense portions (the first dense portion 93 and the second dense portion 73) are the same. However, the materials of the porous portions may be different from the materials of the dense portions. The compositions of the materials of the porous portions may be different from the compositions of the materials of the dense portions.

Figure 4:
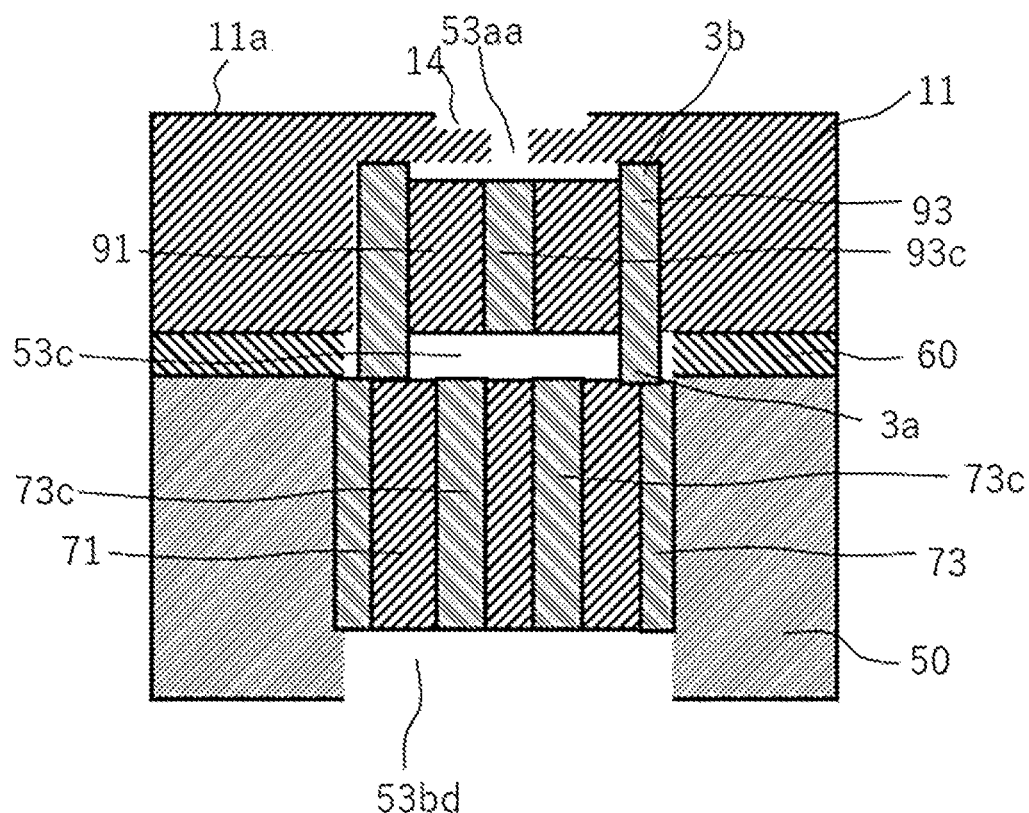
FIG. 4 is a schematic view illustrating an electrostatic chuck according to another embodiment.

FIG. 4 is a schematic view illustrating an electrostatic chuck according to another embodiment.

According to the embodiment, a form is described in which another dense portion is located at a part of the porous part overlapping the gas inlet path 53 (the first hole part 53a) when viewed along the Z-direction.

As shown in FIG. 4, for example, in addition to the first dense portion 93 covering the outer circumference of the first porous portion 91, it is favorable for a first central dense portion 93c to be located at the part of the first porous portion 91 of the porous part 90 overlapping the first part 53aa of the first hole part 53a in the Z-direction. The first central dense portion 93c is more dense than the first porous portion 91. The porosity of the first porous portion 91 is greater than the porosity of the first central dense portion 93c. For example, the density of the first porous portion 91 is less than the density of the first central dense portion 93c. The gas permeability of the first porous portion 91 is greater than the gas permeability of the first central dense portion 93c. For example, the first central dense portion 93c is cylindrical. In such a case, the first porous portion 91 contacts the outer circumference side surface of the first central dense portion 93c and has a ring shape (a tube shape) surrounding the first central dense portion 93c. Because the current that is generated tries to detour around the first central dense portion 93c, the conduction path, i.e., the path in which the current flows, can be lengthened. Therefore, the electrons are not easily accelerated, and the occurrence of the arcing can be suppressed.

From the perspective of arcing suppression, it is favorable to set the dielectric constant of at least one of the first dense portion 93 or the first central dense portion 93c to be less than the dielectric constant of the first porous portion 91. By reducing the dielectric constants of the dense portions, the dielectric breakdown can be suppressed by reducing the potential difference of parts other than the porous part 90 when the electrostatic chuck is used.

A case where another dense portion is provided in the porous part 70 will now be described.

For example, the porous part 70 may include another dense portion in addition to the second dense portion 73 covering the outer circumference of the second porous portion 71. As an example of the other dense portion, a second central dense portion 73c may be provided in a part of the second porous portion 71 overlapping the first part 53aa of the first hole part 53a in the Z-direction. In such a case, for example, the second central dense portion 73c is cylindrical. As another example as shown in FIG. 4, the second central dense portion 73c may be located at a position in the second porous portion 71 facing the current that detours around the first central dense portion 93c. In such a case, for example, the cylindrical porous portion (a central porous portion) similar to the second porous portion 71 is located inside the second central dense portion 73c. The porosity, density, and gas permeability of the central porous portion may be similar to those of the second porous portion 71. The second central dense portion 73c is more dense than the second porous portion 71. The porosity of the second porous portion 71 is greater than the porosity of the second central dense portion 73c. For example, the density of the second porous portion 71 is less than the density of the second central dense portion 73c. The gas permeability of the second porous portion 71 is greater than the gas permeability of the second central dense portion 73c. The second central dense portion 73c may have a ring shape (a tube shape) that contacts the outer circumference side surface of the central porous portion and surrounds the outer circumference side surface of the central porous portion. When the second central dense portion 73c is provided, the second porous portion 71 contacts the outer circumference side surface of the second central dense portion 73c and has a ring shape (a tube shape) surrounding the second central dense portion 73c. It is also favorable for a part of the first central dense portion 93c and a part of the second central dense portion 73c to overlap when viewed along the Z-direction. It is more desirable for the second central dense portion 73c to have a ring shape that covers the first central dense portion 93c when viewed along the Z-direction. The conduction path, i.e., the path in which the current flows, can be lengthened thereby, and the occurrence of the arcing can be more effectively suppressed. For example, the central porous portion that is located inside the ring-shaped second central dense portion 73c overlaps the first central dense portion 93c in the Z-direction. Similarly to the first dense portion 93 and the first central dense portion 93c, it is favorable to set the dielectric constant of at least one of the second dense portion 73 or the second central dense portion 73c to be less than the dielectric constant of the second porous portion 71.

Otherwise, for details of the first central dense portion 93c and the second central dense portion 73c, the content of JP-A 2020-072261 (Kokai) and JP-A 2020-150257 (Kokai) are hereby incorporated herein by reference as a part of the specification.

Figure 5:
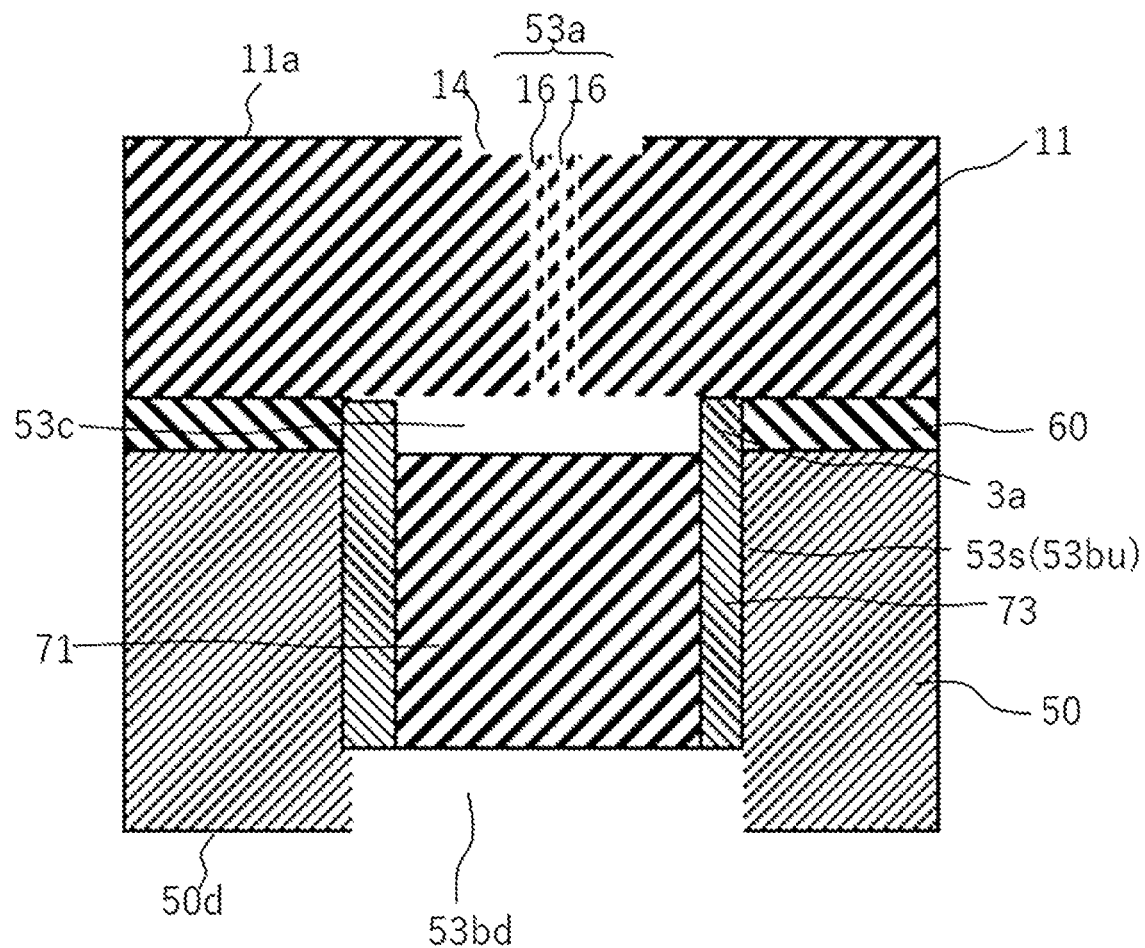
FIG. 5 is a schematic view illustrating an electrostatic chuck according to another embodiment.

FIG. 5 is a schematic view illustrating an electrostatic chuck according to another embodiment.

In the example, the counterbore part 53s is located in the second hole part 53b; and the porous part 70 is located in the counterbore part 53s. The first hole part 53a includes multiple pores 16. In the example, the length along the X or Y-direction of each pore 16 (the diameter of the pore 16) is sufficiently less than the lateral width (t1a) of the first part 53aa illustrated in FIGS. 2 to 4. Specifically, the diameter of the pore 16 is 0.01 millimeters (mm) to 0.2 millimeters (mm).

For example, the multiple pores 16 can be formed in the ceramic dielectric substrate 11 by irradiating a laser, ultrasonic machining, etc. One end of each of the multiple pores 16 may be positioned in the groove 14. The other end of each of the multiple pores 16 is positioned at the second major surface 11b of the ceramic dielectric substrate 11. In other words, the multiple pores 16 extend through the ceramic dielectric substrate 11 in the Z-direction.

In the example shown in FIG. 5, the multiple pores 16 included in the first hole part 53a each are located inward of the ring-shaped first protruding part 3a when viewed along the Z-direction. The arcing resistance can be increased thereby. The penetration of particles into the pores 16 is suppressed even when particles are generated by plasma corrosion of the end part 60e of the bonding part 60. The arcing suppression effect can be continuously maintained thereby. According to the embodiment as well, the arcing suppressor part (not illustrated) described above can be provided in the third hole part 53c. Also, the second central dense portion 73c may be provided in the porous part 70 at a position overlapping the multiple pores 16 when viewed along the Z-direction.

For example, the porosities of the ceramic dielectric substrate 11 and the porous part 70 are calculated by image analysis of image obtained by a scanning electron microscope. The density is measured based on JIS C 21415.4.3.

Manufacturing Method

A method for manufacturing the electrostatic chuck according to the embodiment described above will now be described.

The ceramic dielectric substrate 11 in which the porous part 90 is located in the first hole part 53a is prepared; and the base plate 50 in which the porous part 70 is located in the second hole part 53b is prepared. The bonding part 60 is formed by bonding the base plate 50 and the ceramic dielectric substrate 11 with an adhesive, etc., so that the first hole part 53a and the second hole part 53b face each other. A dense portion that includes the first protruding part is used as the porous part 90 or the porous part 70. Then, the porous part 90 is disposed in the first hole part 53a or the porous part 70 is disposed in the second hole part 53b so that the first protruding part is at the bonding part 60 side. When the first hole part 53a is formed of the multiple pores 16, the porous part 70 is disposed in the second hole part 53b so that the first protruding part is at the bonding part 60 side; and instead of preparing the ceramic dielectric substrate 11 in which the porous part 90 is located in the first hole part 53a, the ceramic dielectric substrate 11 in which the multiple pores 16 are formed as the first hole part 53a may be prepared. As described above, the multiple pores 16 can be formed by irradiating a laser, ultrasonic machining, etc. The bonding part 60 is formed so that the pores 16 and the second hole part 53b communicate with each other.

Processing Apparatus

Figure 6:
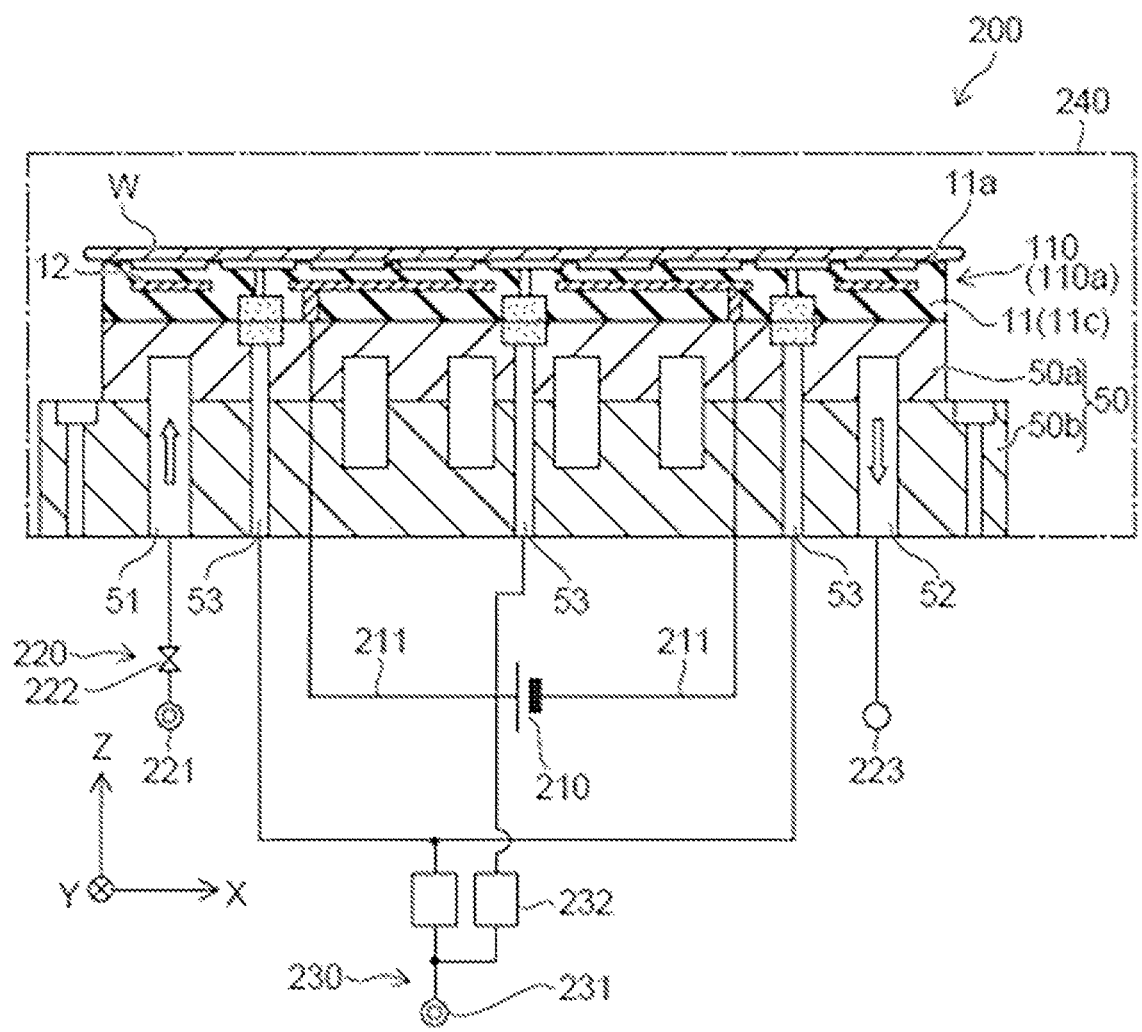
FIG. 6 is a schematic view illustrating a processing apparatus according to the embodiment.

FIG. 6 is a schematic view illustrating a processing apparatus 200 according to the embodiment.

As shown in FIG. 6, the processing apparatus 200 can include the electrostatic chuck 110, the power supply 210, a medium supply part 220, and a supply part 230.

The power supply 210 is electrically connected with the electrode 12 located in the electrostatic chuck 110. The power supply 210 can be, for example, a DC power supply. The power supply 210 applies a prescribed voltage to the electrode 12. A switch that switches between the application of the voltage and the cutoff of the application of the voltage also can be included in the power supply 210.

The medium supply part 220 is connected to the inlet path 51 and the outlet path 52. For example, the medium supply part 220 can supply a liquid used as a cooling medium or a heat-retaining medium.

The medium supply part 220 includes, for example, a storage part 221, a control valve 222, and a discharge part 223.

The storage part 221 can be, for example, a tank, factory piping, etc., storing a liquid. A cooling device and/or a heating device that controls the temperature of the liquid can be included in the storage part 221. A pump for supplying the liquid, etc., also can be included in the storage part 221.

The control valve 222 is connected between the inlet path 51 and the storage part 221. The control valve 222 can control at least one of the flow rate or the pressure of the liquid. The control valve 222 also may be able to switch between the supply of the liquid and the cutoff of the supply.

The discharge part 223 is connected to the outlet path 52. The discharge part 223 can be a tank, drain pipe, or the like that recovers the liquid discharged from the outlet path 52. The discharge part 223 is not always necessary; the liquid that is discharged from the outlet path 52 may be supplied to the storage part 221. Thus, resource conservation can be realized by circulating the cooling medium or the heat-retaining medium.

The supply part 230 includes a gas supply part 231 and a gas controller 232.

The gas supply part 231 can be a high-pressure cylinder, factory piping, or the like that stores a gas such as helium, etc. Although a case is illustrated where one gas supply part 231 is provided, multiple gas supply parts 231 may be provided.

The gas controller 232 is connected between the gas supply part 231 and multiple gas inlet paths 53. The gas controller 232 can control at least one of the flow rate or the pressure of the gas. The gas controller 232 also can have the function of switching between the supply of the gas and the cutoff of the supply. For example, the gas controller 232 can be a mass flow controller, a mass flow meter, etc.

As shown in FIG. 5, multiple gas controllers 232 can be provided. For example, the gas controllers 232 can be located in multiple regions of the first major surface 11a. Thus, the control of the supplied gas can be performed for each of the multiple regions. In such a case, the gas controllers 232 can be provided respectively for the multiple gas inlet paths 53. Thus, the control of the gas in the multiple regions can be more accurately performed. Although a case is illustrated where multiple gas controllers 232 are provided, one gas controller 232 may be used as long as the supply of the gas is independently controllable for the multiple supply systems.

Here, a vacuum chuck, mechanical chuck, or the like is used to hold the object W. However, a vacuum chuck cannot be used in an environment depressurized from atmospheric pressure. When a mechanical chuck is used, there is a risk that the object W may be damaged and/or particles may be generated. Therefore, for example, an electrostatic chuck is used in a processing apparatus used in semiconductor manufacturing processes, etc.

It is necessary to isolate the processing space of such a processing apparatus from the external environment. Therefore, the processing apparatus 200 can further include a chamber 240. For example, the chamber 240 can have an airtight structure that can maintain an atmosphere depressurized from atmospheric pressure.

The processing apparatus 200 also can include multiple lift pins and a drive device that raises and lowers the multiple lift pins. When the object W is received from a transfer apparatus and when the object W is transferred to the transfer apparatus, the lift pins are raised by the drive device and protrude from the first major surface 11a. When the object W received from the transfer apparatus is placed on the first major surface 11a, the lift pins are lowered by the drive device and stored inside the ceramic dielectric substrate 11.

Various devices can be included in the processing apparatus 200 according to the content of the processing. For example, a vacuum pump that exhausts the interior of the chamber 240, etc., can be provided. A plasma generator that generates plasma inside the chamber 240 can be provided. A process gas supply part that supplies a process gas to the interior of the chamber 240 can be provided. A heater that heats the object W and/or the process gas also can be provided inside the chamber 240. The devices that are included in the processing apparatus 200 are not limited to those illustrated. Known technology is applicable to the devices included in the processing apparatus 200; and a detailed description is therefore omitted.

Figure 7:
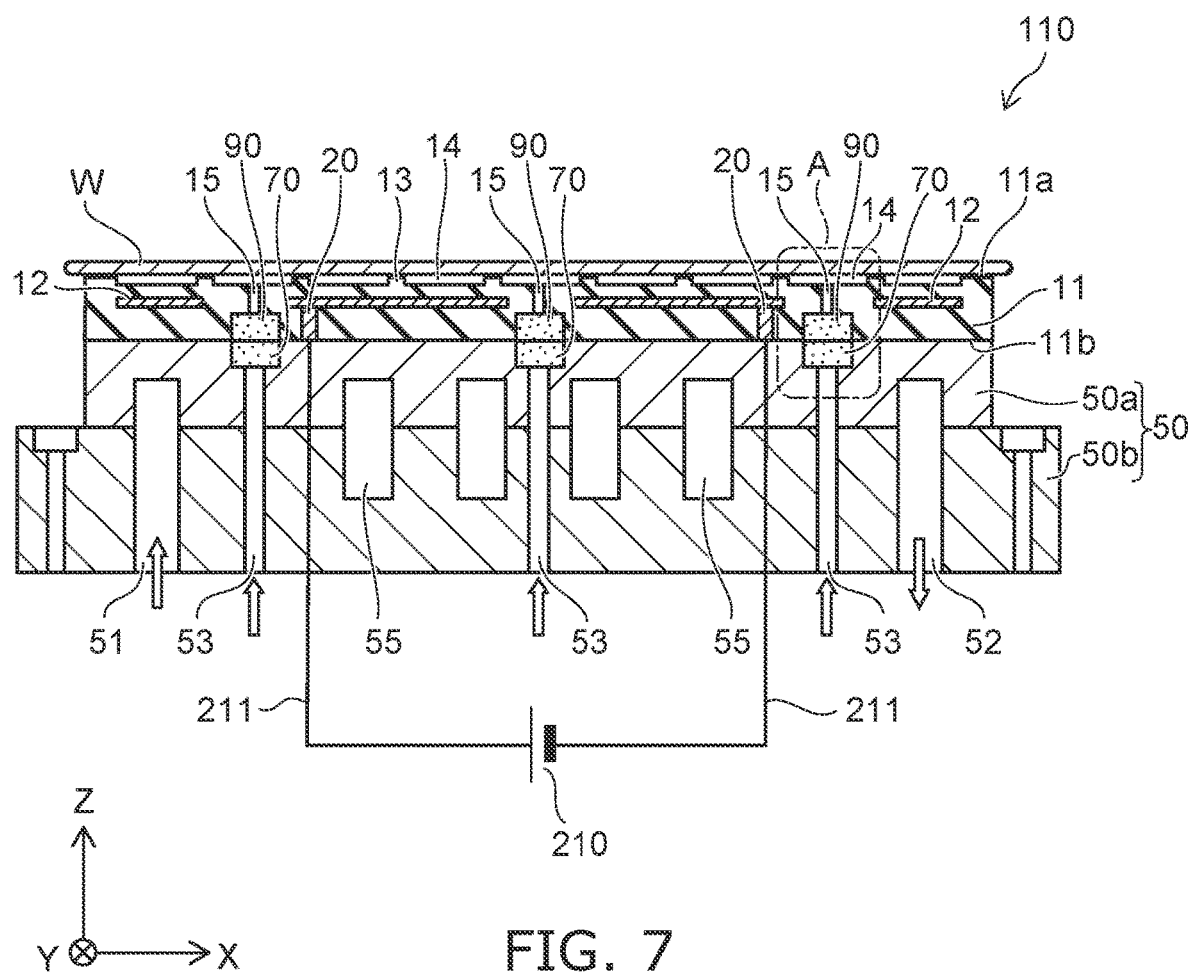
FIG. 7 is a schematic cross-sectional view illustrating the electrostatic chuck according to the embodiment.

FIG. 7 is a schematic cross-sectional view illustrating the electrostatic chuck according to the embodiment.

Figure 8:
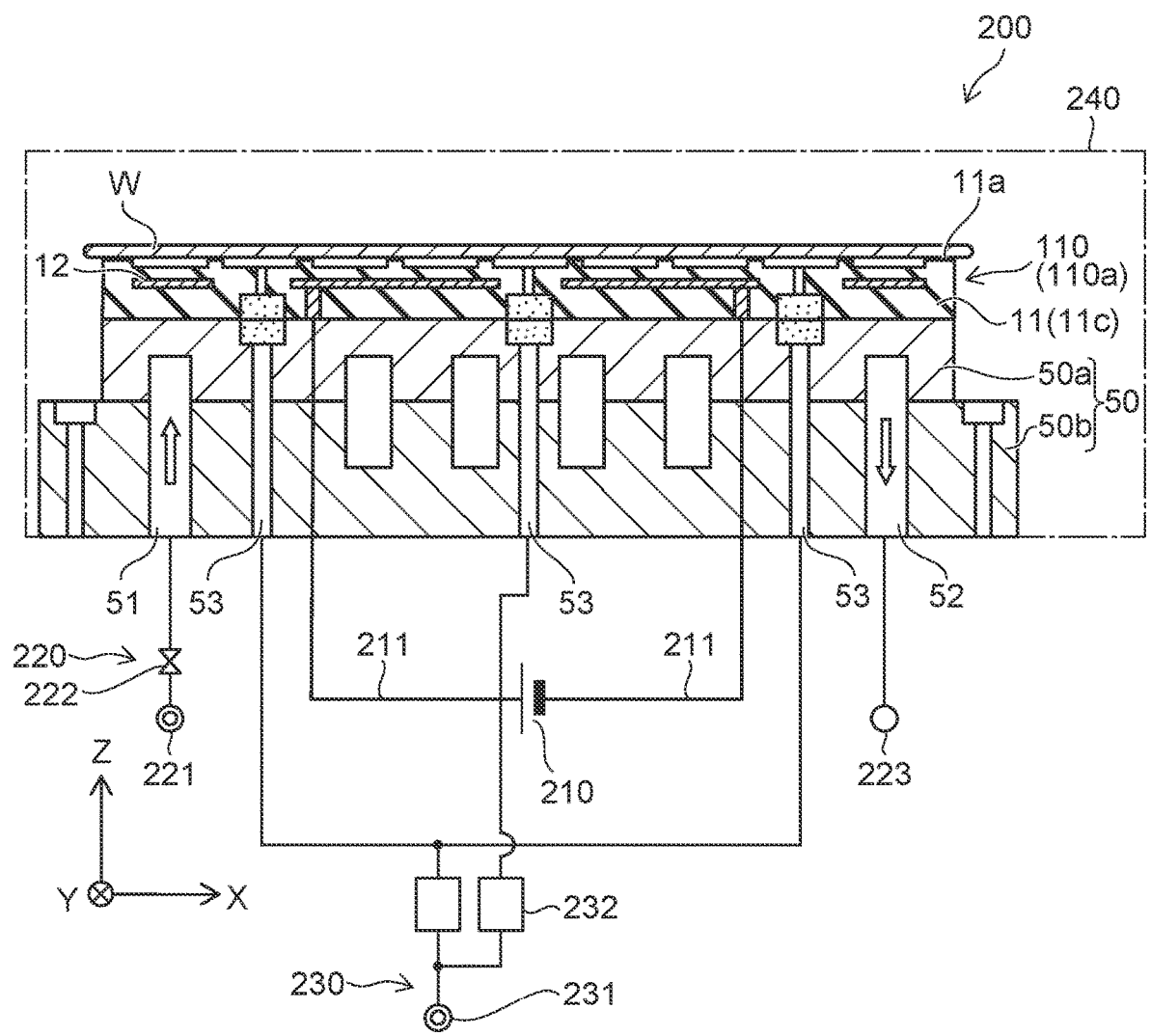
FIG. 8 is a schematic view illustrating the processing apparatus according to the embodiment.

FIG. 8 is a schematic view illustrating the processing apparatus according to the embodiment.

FIG. 7 corresponds to the electrostatic chuck shown in FIG. 1. FIG. 8 corresponds to the processing apparatus shown in FIG. 6.

An electrostatic chuck 110a (an example of the electrostatic chuck 110) and a ceramic dielectric substrate 11c (an example of the ceramic dielectric substrate 11) are included in the example as illustrated in FIG. 8.

Figure 9:
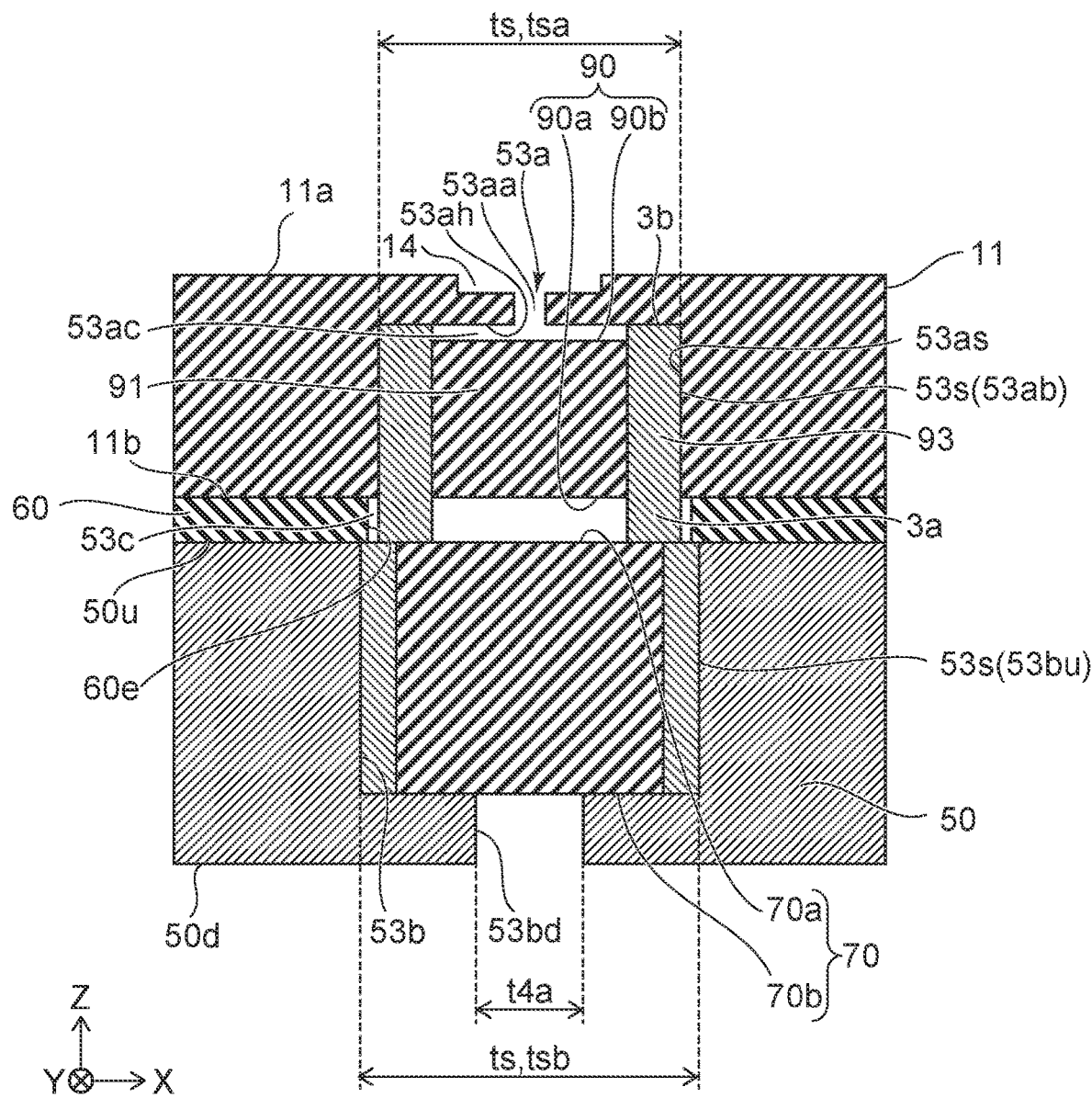
FIG. 9 is a schematic cross-sectional view illustrating the electrostatic chuck according to the embodiment.

FIG. 9 is a schematic cross-sectional view illustrating the electrostatic chuck according to the embodiment.

FIG. 9 is a schematic cross-sectional view illustrating the periphery of the porous parts 90 and 70, and corresponds to FIG. 2A. In the description of the embodiment, a direction from the base plate 50 toward the ceramic dielectric substrate 11 may be called "up", and the direction from the ceramic dielectric substrate 11 toward the base plate 50 may be called "down". The ceramic porous part 90 may be called the porous part 90; and the ceramic porous part 70 may be called the porous part 70.

The first hole part 53a is arranged with the ceramic dielectric substrate 11 in the second direction (one direction in the XY plane). The XY plane is perpendicular to the Z-direction. For example, the first hole part 53a is formed of at least a part of a hole provided in the ceramic dielectric substrate 11. The second hole part 53b is arranged with the base plate 50 in the second direction. For example, the second hole part 53b is formed of at least a part of a hole provided in the base plate 50. The third hole part 53c extends through the bonding part 60 and is arranged with the bonding part 60 in the second direction. For example, the third hole part 53c is formed of at least a part of a space (a hole) surrounded with the bonding part 60.

For example, the shapes in the XY plane of the outer circumferences of the first hole part 53a, the second hole part 53b, and the third hole part 53c are circular. Included in the scope of circular are not only perfectly round circles (perfect circles) but also distorted shapes of perfect circles, e.g., ellipses and flattened circles. Cylindrical is columnar with a circular cross-sectional shape.

The first hole part 53a includes the first part 53aa, the second part 53ab, and the middle part 53ac (the third part). The middle part 53ac is positioned between the first part 53aa and the second part 53ab. For example, the middle part 53ac includes a space between the second surface 90b of the porous part 90 and the ceramic dielectric substrate 11.

The second part 53ab includes the counterbore part 53s. For example, the shapes in the XY plane of the outer circumferences of the first part 53aa, the second part 53ab, the middle part 53ac, and the counterbore part 53s are circular. The length ts (a length tsa) along the second direction of the counterbore part 53s located in the first hole part 53a is greater than the length t1a along the second direction of the first part 53aa (see FIG. 2B). The length ts is, for example, the diameter of the counterbore part 53s and is the maximum width of the planar shape of the counterbore part 53s. The maximum width of the planar shape is the maximum value among the lengths along directions in the XY plane. The length t1a is, for example, the diameter of the first part 53aa and is the maximum width of the planar shape of the first part 53aa. For example, the counterbore part 53s that is located in the first hole part 53a is at least a portion of the part of the first hole part 53a having a greater diameter than the first part 53aa. For example, in the XY plane, the position of the center of the counterbore part 53s is substantially the same as the position of the center of the first part 53aa.

For example, the length ts along the second direction of the counterbore part 53s is not more than the length tc along the second direction of the third hole part 53c (see FIG. 2B). The length tc is, for example, the diameter of the third hole part 53c and is the maximum width of the planar shape of the third hole part 53c.

For example, the length t1 along the second direction of the porous part 90 (see FIG. 2B) is not more than the length ts (the length tsa) of the counterbore part 53s. The length t1 is, for example, the diameter of the porous part 90 and is the maximum width of the planar shape of the porous part 90.

The upper end of the first part 53aa is located in the first major surface 11a of the ceramic dielectric substrate 11 and continuous with the groove 14 of the first major surface 11a. The first part 53aa is directly connected to the groove 14 of the first major surface 11a. The lower end of the second part 53ab is located in the second major surface 11b of the ceramic dielectric substrate 11. The lower end of the counterbore part 53s is located in the second major surface 11b of the ceramic dielectric substrate 11.

The ceramic dielectric substrate 11 includes a counterbore surface 53ah crossing an inner circumference side surface 53as of the first hole part 53a. For example, the counterbore surface 53ah extends in the second direction and faces downward. The lower end of the first part 53aa is located in the counterbore surface 53ah.

The first surface 90a of the porous part 90 is the lower surface at the base plate 50 side; and the second surface 90b is the upper surface. The first surface 90a faces the third hole part 53c and contacts the third hole part 53c. For example, the first surface 90a and the second surface 90b each extend along the XY plane and are substantially planes. The space is formed between the first surface 90a and the porous part 70 (or the base plate 50).

The first protruding part 3a is arranged with the bonding part 60 in the second direction. The bonding part 60 is protected thereby, and exposure in plasma and/or gas is suppressed. In the example of FIG. 9, the bonding part 60 is isolated from the space between the first surface 90a and the porous part 70 (or the base plate 50) by the first protruding part 3a located in the porous part 90. For example, the first protruding part 3a is located so that the bonding part 60 does not directly contact the space of the gas inlet path 53 through which the gas can pass.

For example, in the example of FIG. 9, the lower end of the first protruding part 3a is ring-shaped in the XY plane and contacts at least one of the porous part 70 or the base plate 50 over the entire circumference of the ring shape. For example, the lower end of the first protruding part 3a contacts the second dense portion 73 of the porous part 70. The lower end of the first protruding part 3a may contact the second porous portion 71 of the porous part 70.

In the example, the first protruding part 3a is separated from the end part 60e of the bonding part 60. A space (a part of the third hole part 53c) is located between the first protruding part 3a and the bonding part 60. However, the first protruding part 3a may contact the end part 60e.

The upper end of the second protruding part 3b may contact the counterbore surface 53ah. For example, the upper end of the second protruding part 3b is ring-shaped in the XY plane and contacts the counterbore surface 53ah over the entire circumference of the ring shape. In such a case, the middle part 53ac includes a space defined by the counterbore surface 53ah, the second surface 90b of the porous part 90, and the second protruding part 3b.

As illustrated in FIG. 9, the second hole part 53b includes the third part 53bu and the fourth part 53bd. The third part 53bu includes the counterbore part 53s. In other words, in the example, the counterbore part 53s is located in both the first and second hole parts 53a and 53b. The upper end of the third part 53bu is located at the upper surface 50u of the base plate 50. The upper end of the counterbore part 53s of the second hole part 53b is located at the upper surface 50u. For example, the fourth part 53bd is connected to the lower end of the counterbore part 53s of the second hole part 53b. The lower end of the fourth part 53bd is located at the lower surface 50d of the base plate 50.

For example, the shapes in the XY plane of the outer circumferences of the third part 53bu, the fourth part 53bd, and the counterbore part 53s are circular. As illustrated in FIG. 9, the length is (a length tsb) along the second direction of the counterbore part 53s of the second hole part 53b is greater than a length t4a along the second direction of the fourth part 53bd. The length t4a is, for example, the diameter of the fourth part 53bd and is the maximum width of the planar shape of the fourth part 53bd. For example, the counterbore part 53s of the second hole part 53b is at least a portion of the part of the second hole part 53b having a greater diameter than the fourth part 53bd. For example, in the XY plane, the position of the center of the counterbore part 53s is substantially the same as the position of the center of the fourth part 53bd.

For example, a length t2 along the second direction of the porous part 70 (see FIG. 2B) is not more than the length tsb of the counterbore part 53s of the second hole part 53b. The length t2 is, for example, the diameter of the porous part 70 and is the maximum width of the planar shape of the porous part 70. The length t2 along the second direction of the porous part 70 is substantially equal to a length t2b along the second direction of the third part 53bu (see FIG. 2B). The length t2b is, for example, the diameter of the third part 53bu and is the maximum width of the planar shape of the third part 53bu.

For example, the length tsb is greater than the length tsa; and the length t2 is greater than the length t1. However, these lengths are not limited thereto; the length tsb may be equal to the length tsa or less than the length tsa. The length t2 may be equal to the length t1 or less than the length t1.

The third surface 70a of the porous part 70 is the upper surface at the ceramic dielectric substrate 11 side; and the fourth surface 70b is the lower surface. The third surface 70a faces the third hole part 53c and contacts the third hole part 53c. The third surface 70a faces the first surface 90a via a part of the third hole part 53c. For example, the third surface 70a and the fourth surface 70b each extend along the XY plane and are substantially planes. A space is formed between the third surface 70a and the porous part 90 (or the ceramic dielectric substrate 11).

For example, in the example of FIG. 3 or FIG. 5, the bonding part 60 is isolated from the space between the third surface 70a and the porous part 90 (or the ceramic dielectric substrate 11) by the first protruding part 3a located in the porous part 70. The bonding part 60 is protected thereby, and exposure to plasma and/or gas is suppressed.

For example, in the example of FIGS. 3 and 5, the upper end of the first protruding part 3a is ring-shaped in the XY plane and contacts at least one of the porous part 90 or the ceramic dielectric substrate 11 over the entire circumference of the ring shape. For example, in the example of FIG. 3, the upper end of the first protruding part 3a contacts the first dense portion 93 of the porous part 90 and the ceramic dielectric substrate 11. The upper end of the first protruding part 3a may contact the first porous portion 91 of the porous part 90.

In the example of FIG. 3, the first protruding part 3a contacts the end part 60e of the bonding part 60. However, the first protruding part 3a of the porous part 70 may be separated from the end part 60e of the bonding part 60. In other words, a space (a part of the third hole part 53c) may be located between the bonding part 60 and the first protruding part 3a of the porous part 70.

"Substantially the same", "the same", "substantially equal", and "equal" are not limited to exactly the same or equal and may include, for example, differences in ranges caused by manufacturing fluctuation or play in manufacturing (e.g., a slight gap for disposing the porous part inside the counterbore part, etc.).

Embodiments may include the following configurations.
Configuration 1

An electrostatic chuck, comprising:
a ceramic dielectric substrate including
a first major surface on which an object of clamping is placed, and
a second major surface at a side opposite to the first major surface;
a base plate supporting the ceramic dielectric substrate, the base plate including
an upper surface at the ceramic dielectric substrate side, and
a lower surface at a side opposite to the upper surface;
a bonding part located between the ceramic dielectric substrate and the base plate;
a gas inlet path extending through the ceramic dielectric substrate, the base plate, and the bonding part, the gas inlet path including
a first hole part positioned at the ceramic dielectric substrate,
a second hole part positioned at the base plate, and a third hole part positioned at the bonding part;
a counterbore part located in at least one of the first hole part or the second hole part; and
a ceramic porous part located in the counterbore part, the ceramic porous part including an exposed surface exposed in the third hole part, a first direction being a direction from the base plate toward the ceramic dielectric substrate, a second direction being a direction substantially orthogonal to the first direction, the ceramic porous part including a porous portion that is gas-permeable, and a dense portion that is denser than the porous portion, the dense portion covering an outer circumference of the porous portion, at least a part of the dense portion including a first protruding part protruding toward the third hole part along the first direction from the exposed surface.

Configuration 2

The chuck according to configuration 1, wherein a length from the exposed surface along the first direction of the first protruding part is substantially equal to a length along the first direction of the bonding part.

Configuration 3

The chuck according to configuration 1 or 2, wherein the counterbore part is located in the first hole part.

Configuration 4

The chuck according to configuration 3, wherein the first hole part includes:

a first part open at the first major surface side;

a second part open at the second major surface side, and a middle part located between the first part and the second part, the counterbore part is located in the second part, a length of the middle part along the second direction is greater than a length of the first part along the second direction, the ceramic porous part includes a surface at a side opposite to the exposed surface, and the surface is exposed in the middle part.

Configuration 5

The chuck according to configuration 4, wherein the dense portion further includes a second protruding part protruding toward the first part along the first direction from the surface.

Configuration 6

An electrostatic chuck, comprising:

a ceramic dielectric substrate including a first major surface on which an object of clamping is placed, and a second major surface at a side opposite to the first major surface;

a base plate supporting the ceramic dielectric substrate, the base plate including an upper surface at the ceramic dielectric substrate side, and a lower surface at a side opposite to the upper surface;

a bonding part located between the ceramic dielectric substrate and the base plate;

a gas inlet path extending through the ceramic dielectric substrate, the base plate, and the bonding part, the gas inlet path including a first hole part positioned at the ceramic dielectric substrate, a second hole part positioned at the base plate, and a third hole part positioned at the bonding part;

a counterbore part located in the second hole part; and a ceramic porous part located in the counterbore part, the ceramic porous part including an exposed surface exposed in the third hole part, a first direction being a direction from the base plate toward the ceramic dielectric substrate, a second direction being a direction substantially orthogonal to the first direction, the ceramic porous part including a porous portion that is gas-permeable, and a dense portion that is denser than the porous portion, the dense portion covering an outer circumference of the porous portion, at least a part of the dense portion including a first protruding part protruding toward the third hole part along the first direction from the exposed surface, the first hole part including a plurality of pores.

Configuration 7

A processing apparatus, comprising:

the chuck according to any one of configurations 1 to 6; and a supply part configured to supply a gas to the gas inlet path of the chuck.

In this specification, "perpendicular", "parallel", and "orthogonal" include not only exactly perpendicular, exactly parallel, and exactly orthogonal but also, for example, the fluctuation due to manufacturing processes, etc.; and it is sufficient to be substantially perpendicular, substantially parallel, or substantially orthogonal.

The invention has been described with reference to the embodiments. However, the invention is not limited to these embodiments. Although a configuration that uses a Coulomb force is illustrated as the electrostatic chuck 110 as an example, a configuration that uses a Johnsen-Rahbek force also is applicable to the electrostatic chuck 110. Any design changes in the above embodiments suitably made by those skilled in the art are also encompassed within the scope of the invention as long as they fall within the spirit of the invention. The components included in the embodiments described above can be combined to the extent possible, and these combinations are also encompassed within the scope of the invention as long as they include the features of the invention.

What is claimed is:

1. An electrostatic chuck, comprising:
a ceramic dielectric substrate including
a first major surface on which an object of clamping is placed, and
a second major surface at a side opposite to the first major surface;
a base plate supporting the ceramic dielectric substrate, the base plate including
an upper surface at the ceramic dielectric substrate side, and
a lower surface at a side opposite to the upper surface;
a bonding part located between the ceramic dielectric substrate and the base plate;
a gas inlet path extending through the ceramic dielectric substrate, the base plate, and the bonding part, the gas inlet path including
a first hole part positioned at the ceramic dielectric substrate,
a second hole part positioned at the base plate, and a third hole part positioned at the bonding part;
a counterbore part located in at least one of the first hole part or the second hole part; and
a ceramic porous part located in the counterbore part,
the ceramic porous part including an exposed surface exposed in the third hole part,
a first direction being a direction from the base plate toward the ceramic dielectric substrate, a second direction being a direction substantially orthogonal to the first direction,
the ceramic porous part including
a porous portion that is gas-permeable, and
a dense portion that is denser than the porous portion,
the dense portion covering an outer circumference of the porous portion,
at least a part of the dense portion including a first protruding part protruding toward the third hole part along the first direction from the exposed surface.

2. The chuck according to claim 1, wherein
a length from the exposed surface along the first direction of the first protruding part is substantially equal to a length along the first direction of the bonding part.

3. The chuck according to claim 1, wherein
the counterbore part is located in the first hole part.

4. The chuck according to claim 3, wherein
the first hole part includes:
a first part open at the first major surface side;
a second part open at the second major surface side, and
a middle part located between the first part and the second part,
the counterbore part is located in the second part,
a length of the middle part along the second direction is greater than a length of the first part along the second direction,
the ceramic porous part includes a surface at a side opposite to the exposed surface, and
the surface is exposed in the middle part.

5. The chuck according to claim 4, wherein
the dense portion further includes a second protruding part protruding toward the first part along the first direction from the surface.

6. An electrostatic chuck, comprising:
a ceramic dielectric substrate including
a first major surface on which an object of clamping is placed, and
a second major surface at a side opposite to the first major surface;
a base plate supporting the ceramic dielectric substrate, the base plate including
an upper surface at the ceramic dielectric substrate side, and
a lower surface at a side opposite to the upper surface;
a bonding part located between the ceramic dielectric substrate and the base plate;
a gas inlet path extending through the ceramic dielectric substrate, the base plate, and the bonding part, the gas inlet path including
a first hole part positioned at the ceramic dielectric substrate,
a second hole part positioned at the base plate, and
a third hole part positioned at the bonding part;
a counterbore part located in the second hole part; and
a ceramic porous part located in the counterbore part,
the ceramic porous part including an exposed surface exposed in the third hole part,
a first direction being a direction from the base plate toward the ceramic dielectric substrate,
a second direction being a direction substantially orthogonal to the first direction,
the ceramic porous part including
a porous portion that is gas-permeable, and
a dense portion that is denser than the porous portion,
the dense portion covering an outer circumference of the porous portion,
at least a part of the dense portion including a first protruding part protruding toward the third hole part along the first direction from the exposed surface,
the first hole part including a plurality of pores.

7. A processing apparatus, comprising:
the chuck according to claim 1; and
a supply part configured to supply a gas to the gas inlet path of the chuck.

* * * * *